United States Patent [19]

Milkovic

[11] 4,296,413
[45] Oct. 20, 1981

[54] RESISTANCE-BRIDGE TO FREQUENCY CONVERTER WITH AUTOMATIC OFFSET CORRECTION

[75] Inventor: Miran Milkovic, Scotia, N.Y.

[73] Assignee: General Electric Company, Schenectady, N.Y.

[21] Appl. No.: 79,825

[22] Filed: Sep. 28, 1979

[51] Int. Cl.³ .................. G08C 19/04; G08C 19/12
[52] U.S. Cl. ....................... 340/870.38; 324/62; 340/870.26; 340/870.42
[58] Field of Search ............... 340/870.38, 870.42, 340/870.18, 870.16, 870.17, 870.26, 599; 324/62, 65 R; 73/362 AR, 719, 725, 313

[56] References Cited

U.S. PATENT DOCUMENTS

| | | | |
|---|---|---|---|
| 3,536,997 | 10/1970 | Holt | 324/62 R |
| 3,609,728 | 9/1971 | Quinn et al. | 340/599 |
| 3,668,673 | 6/1972 | Adler | 340/870.26 |
| 3,800,300 | 3/1974 | Van Oosterhout | 340/870.26 |
| 3,898,554 | 8/1975 | Knudsen | 340/870.38 |
| 3,955,138 | 5/1976 | Milkovic | 324/107 |
| 4,015,140 | 3/1977 | Milkovic | 307/229 |

Primary Examiner—James J. Groody
Attorney, Agent, or Firm—Geoffrey H. Krauss; James C. Davis; Marvin Snyder

[57] ABSTRACT

A circuit for converting changes in a sensed physical parameter, such as resistance and resistance change as a function of pressure, temperature and the like, into a digital signal of proportional frequency. A sensor bridge, monitoring the parameter to be measured, forms a part of a feedback loop controlling a current into a resistance-capacitance integrator which is part of a controlled oscillator. The oscillator has automatic offset error correction. The frequency of the sensor-controlled is proportional to the unbalance in the sensor bridge. The converter receives power on a two-wire line from a power supply which may be located remotely therefrom, and from which power supply the sensed-parameter-established frequency is extracted for use by processing-control apparatus and the like.

14 Claims, 4 Drawing Figures

RESISTANCE-BRIDGE TO FREQUENCY CONVERTER WITH AUTOMATIC OFFSET CORRECTION

BACKGROUND OF THE INVENTION

The present invention relates to circuitry for sensing physical parameters and, more particularly, to a novel circuit for converting the change in resistance of a resistance bridge, sensing the physical parameter, to the frequency of a waveform, for subsequent processing.

Many applications are known in which a physical parameter, such as temperature, pressure, humidity, air flow, and the like, or the difference in a physical parameter, must be sensed. The magnitude of the parameter is often sensed by a sensor having a changing electrical resistance proportional to the changing magnitude of the sensed parameter. Quite frequently, the change in sensor resistance is small and, if the sensor operates in an electrically noisy environment, the electrical noise tends to mask the changes in sensor output, thereby limiting resolution. Also, it is frequently required to interface the sensor output to process-control apparatus utilizing digital electronics, whereby digital sensor data output is required. Further, it is frequently necessary to transmit the sensed signal over a relatively long path to the apparatus requiring the sensor output information. It is known to overcome these difficulties by converting the sensor output to a waveform having a frequency proportional to the magnitude of the sensor output and to transmit the varying-frequency waveform to the receiving apparatus. Circuitry capable of carrying out the sensed parameter-to-frequency conversion, in cost-effective and highly-accurate manner, is very desirable.

BRIEF SUMMARY OF THE INVENTION

In accordance with the invention, a circuit for converting the value of a sensed physical parameter into an output waveform having a frequency linearly proportional to the parameter magnitude, includes a four-terminal resistance bridge sensor having an equivalent resistance, between each pair of terminals, which varies with the magnitude of the sensed physical parameter; means connected to a pair of opposed terminals of the sensor for causing an essentially constant flow of current through the resistances of the sensor; means connected to the remaining pair of sensor terminals for amplifying at least one sensor output voltage varying in proportion to the change in the sensed physical parameter; an integrator having an output voltage which is the integral, with respect to time, of the summation of the parameter-sensing voltage and one of a pair of reference voltages of essential identical magnitude and opposite polarity. The integrator output voltage is compared to the opposite polarity reference voltages to generate first and second signals when the integrator output voltage is equal to the positive and negative polarity reference voltages, respectively. The first and second comparator output signals enable first and second switches means to control the polarity of the reference voltage applied to the integrator. Either comparator output can supply the circuit output waveform, having a frequency proportional to the magnitude of the change in resistance of the sensor, and responsive to the change in the magnitude of the sensed physical parameter.

In one preferred embodiment of my invention, the converter is at a location remote from the location of user apparatus. A power supply and optical coupler are utilized at the user apparatus location to provide power to the remote converter. A power supply circuit generates substantially identical reference voltages of opposite polarity, centered about a virtual-ground voltage. The power supply circuit also pulses the current from the master potential source to provide an optically coupled output voltage at the frequency of the converter.

Accordingly, it is an object of the present invention to provide a novel resistance-bridge-to-frequency converter for providing a waveform having a frequency proportionally related to the change in resistance of a resistance-bridge sensor sensing a physical parameter.

This and other objects of the present invention will become apparent upon consideration of the following detailed description, and of the accompanying drawings.

DETAILED DESCRIPTION OF THE INVENTION

Figure 1:
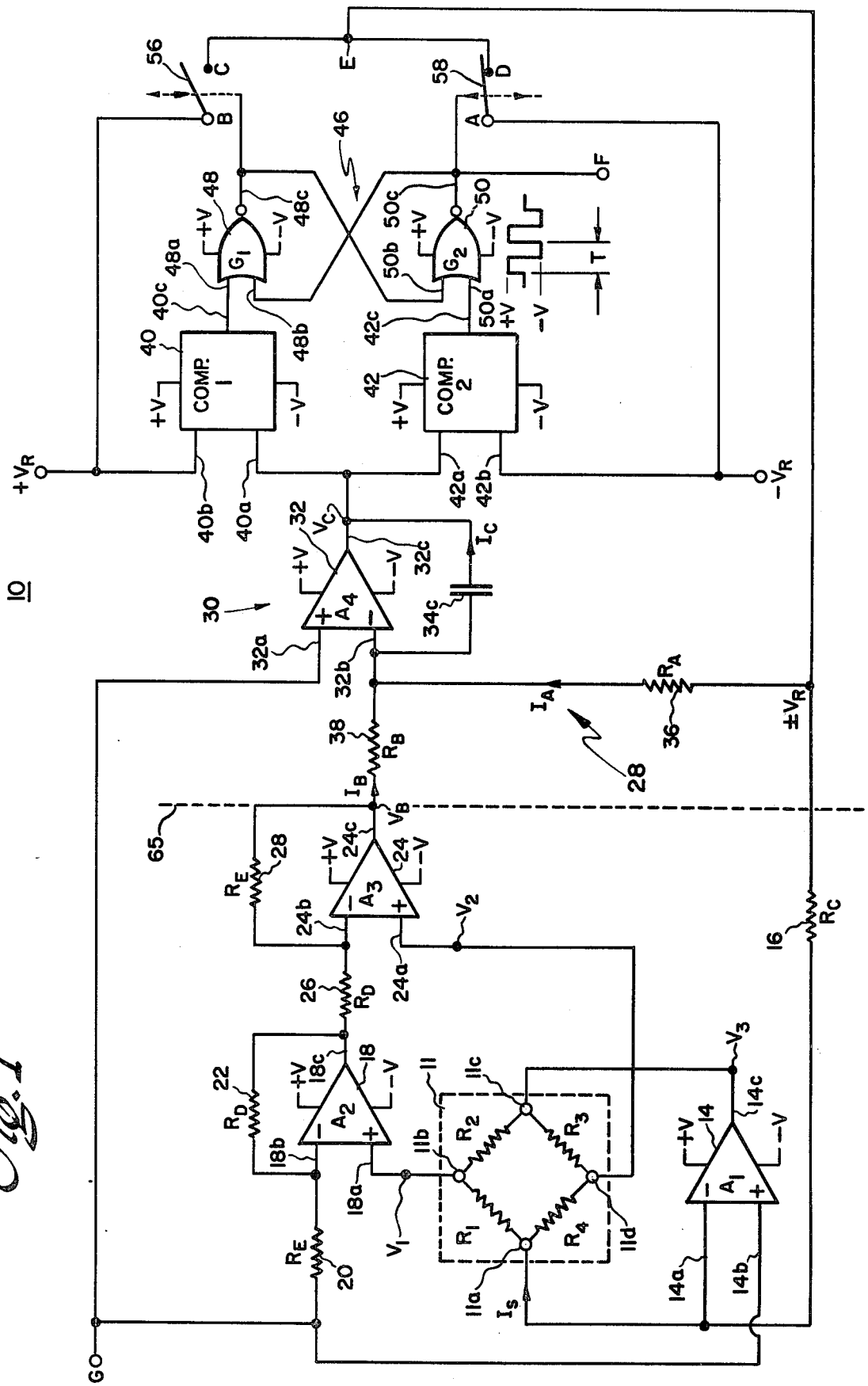
FIG. 1 is a schematic diagram of a resistance-bridge to frequency converter circuit in accordance with the principles of the present invention.
Figure 2:
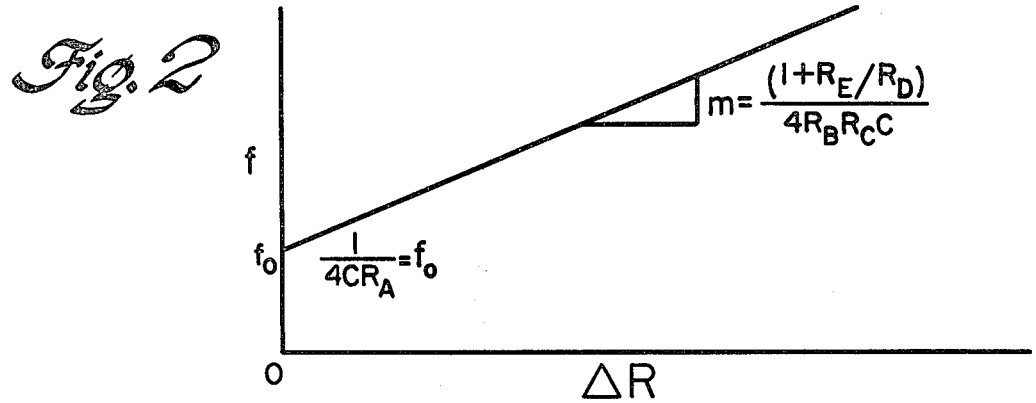
FIG. 2 is a graph illustrating the relationship between a parameter-responsive change in sensor resistance and the output frequency of the converter circuit of FIG. 1.

Referring initially to FIGS. 1 and 2, one preferred embodiment of my novel converter circuit 10 utilizes a physical parameter sensor 11 of the resistance-bridge type. Sensor 11 is a four terminal device, i.e. having terminals 11a–11d, with one of four equivalent resistances $R_1$–$R_4$ measurable between each pair of output terminals. The magnitude of each equivalent resistance, or the change in the magnitude of each equivalent resistance $R_1$–$R_4$, is a function of the sensed parameter, such as temperature, pressure, differential temperature, differential pressure and the like. Thus, at some reference value of the sensed physical parameter, values of resistances $R_1$ (between terminals 11a and 11b), $R_2$ (between terminals 11b and 11c), $R_3$ (between terminals 11c and 11d) and $R_4$ (between terminals 11d and 11a) are known, as are the incremental resistances $\Delta R_1$, $\Delta R_2$, $\Delta R_3$ and $\Delta R_4$ for an incremental change in the sensed physical parameter.

Sensor 11 receives a constant sensor current $I_s$ flowing into or out of sensor-bridge terminals 11a and 11c. The constant current is provided by placing the resistance-bridge sensor in the feedback loop of an operational amplifier 14. This operational amplifier $A_1$, receiving operating potentials $+V$ and $-V$, has an inverting input 14a connected to resistance-bridge sensor terminal 11a and to a fixed resistance 16 of magnitude $R_C$. A non-inverting input 14b is connected to virtual-ground terminal G. The operational amplifier output 14c, at which a voltage of magnitude $V_3$ appears, is connected to sensor terminal 11c, opposite to sensor terminal 11a in the bridge.

The flow of sensor current $I_S$ divides between the pair of bridge legs consisting of resistances $R_1$–$R_2$ and $R_4$–$R_3$. A voltage drop exits across each of the four bridge resistances; first and second voltages, respectively of magnitudes $V_1$ and $V_2$, appear at bridge terminals 11b and 11d, respectively. Bridge terminal 11b is connected to the non-inverting input 18a of a second amplifier 18. The second operational amplifier $A_2$, also receiving operating potentials of $+V$ and $-V$ magnitudes, has an inverting input 18b connected through a resistance 20, of magnitude $R_E$, to virtual-ground connection G, and is connected via a feedback resistance 22, of magnitude $R_D$, to the output 18c of operation amplifier $A_2$. Bridge terminal 11d is connected to a non-inverting input 24a of a third operational amplifier 24. The third operational amplifier $A_3$, also receiving the operating potentials of magnitude $+V$ and $-V$, has an inverting input 24b connected via a resistance 26 of magnitude $R_D$, to the output 18c of second operational amplifier $A_2$. A feedback resistance 28, of magnitude $R_E$, is connected beten inverting input 24b and an output 24c of the third operational amplifier.

A voltage-to-frequency converter 28 includes a two-input summing integrator 30 using a fourth operational amplifier 32, also receiving operational potentials of magnitudes $\pm V$, and having a non-inverting input 32a connected to virtual-ground point G. An inverting input 32b of the fourth operational amplifier $A_4$ is connected to: one terminal of an integrating capacitance 34, of magnitude C, having the other terminal thereof connected to an output 32c of the operational amplifier $A_4$ and through which integrating capacitance an integrator current $I_C$ flows; a first integrator input resistance 36, of magnitude $R_A$, connected to the terminal of resistance 16 furthest from the operational amplifier $A_1$ inverting input 14a and through which resistance 36 a first integrator input current $I_A$ flows toward and away from amplifier input 32b; and a second integrator input resistance 38, of magnitude $R_B$, having its remaining terminal connected to the output 24c of the operational amplifier $A_3$, and through which resistance 38 a second integrator input current $I_B$ flows towards and away from amplifier non-inverting input 32b.

The $A_4$ output 32c, at which a voltage of magnitude $V_C$ appears, is connected in parallel to the respective first inputs 40a and 42a of first and second comparison means 40 and 42. The first comparative emans (COMP. 1) has a second input 40b receiving a reference voltage of a first, e.g. positive, polarity and fixed magnitude $V_R$, while the second comparison means (COMP. 2) has a second input 42b receiving a reference voltage of the same magnitude $V_R$, but of the opposite, e.g. negative, polarity, Both COMP. 1 and COMP. 2 receive the pair of operating potentials of magnitude $+V$ and $-V$, which magnitude V is greater than the reference voltage magnitude $V_R$. An output 40c of COMP. 1 is enabled whenever the voltage at input 40a is equal to, or greater than, the magnitude of the positive reference voltage at input 40b. An output 42c of COMP. 2 is enabled whenever the voltage at the first input 42a thereof is equal to, or less than, the negative reference voltage at second input 42b.

A flip-flop 46 is formed of cross-coupled first and second gating elements 48 and 50. In the illustrated embodiment, gates 48 and 50 are each two-input NOR gates $G_1$ and $G_2$, respectively. Each of gates $G_1$ and $G_2$ have a first input 48a and 50a, respectively, connected to the respective outputs 40c and 42c of COMP. 1 and COMP. 2, respectively. Gates $G_1$ and $G_2$ have respective second inputs 48b and 50b respectively connected to the outputs 50c and 48c, respectively, of the other gate. Gate $G_2$ output 50c is connected to terminal F, at which the output waveform, having a frequency proportional to the sensed physical parameter, is present.

It should be understood that the output frequency can be taken from the output 48c of the other gate $G_1$ or from either of the comparing means outputs 40c or 42c, as desired. With suitable buffering (not shown), as by a high-input impedance voltage follower and the like, the output frequency waveform may be taken from node E. Suitable amplitude scaling means may be used if desired, as the sensor information is contained in the variable frequency of the converter output, and is not related to the output voltage amplitude.

Gate $G_1$ output 48c and gate $G_2$ output 50c are respectively connected to close, when enabled in mutually exclusive manner, respective single-pole, single-throw switch means 56 and 58. One terminal A of switch means 58 is connected to the source of the negative reference voltage $(-V_R)$ while one terminal B of switch means 56 is connected to the source of positive reference voltage potential $(+V_R)$. The remaining switch terminals (terminal C of switch means 56 and terminal D of switch means 58) are connected in parallel to form a switch means output node E which is connected to the junction between resistances 16 and 36, and at which node E a voltage of magnitude $V_R$ and of switchable positive and negative polarity, will be present depending upon the state of flip-flop 46. It should be understood that switch means 56 and 58 may be mechanical, electromechanical or electronic in nature and may also be combined into a single-pole, double-throw switch means. It should also be understood that flip-flop 46 may be any bistable element. Further, the comparison means, the bistable element and/or the switch means may be combined into a single means to which the opposite polarity reference voltage and the integrator output voltage are connected, and which single means provides an output voltage (for connection to node E) of the reference voltage magnitude and of polarity dependent upon the magnitude of integrator voltage Vc and reversing polarity whenever Vc ramps up (or down) to the positive (or negative) reference voltage magnitude.

In operation, it is assumed that switch means 58 is initially closed, and switch means 56 is initially open, whereby node E is at the negative reference potential $-V_R$. As non-inverting input 14b of amplifier $A_1$ is at virtual ground, the total current $I_s$ flowing through the sensor bridge resistance is established only by the reference voltage magnitude $V_R$ and the resistance $R_C$ of resistor 16, i.e. $I_S=(V_R/R_C)$. The voltage $V_B$, at the output 24c of amplifier $A_3$ is a function of the pair of sensor voltages $V_1$ and $V_2$, as well as the gains of amplifier $A_2$ and $A_3$, which gains are established by respective associated resistances 20 and 22, and 26 and 28, respectively. Thus, $$V_B=(1+(R_E/R_D))(V_1-V_2).$$

As inverting input 32a of amplifier $A_4$ is at virtual ground, the current $I_C$ flowing through integrating capacitor 34 is equal to the sum of the first and second input currents $I_A$ and $I_B$, respectively. $I_A$ has a magnitude established by the magnitude of the reference voltage $V_R$ and the reistance $R_A$ of resistor 36, while current $I_B$ has a magnitude established by the magnitude of voltage $V_B$ and the resistance $R_B$ of resistor 38. Thus, $$I_C = (V_R R_A) + (V_B / R_B).$$

After switch 58 closes, the integrator output voltage $V_C$ linearly increases, toward operating voltage $+V$, until output voltage $V_C$ reaches $+V_R$; the voltages at both inputs 40a and 40b of COMP. 1 are now equal and the output 40c of the comparator is enabled. Enablement of output 40c sets the output 48c of the gate $G_1$ to $+V$ volts, closing switch means 56 and resets the output 50c of gate $G_2$ to $-V$ volts, opening switch means 58. The voltage at node E is thus switched to the positive reference potential $+V_R$. The bridge current $I_s$ reverses direction, responsive to the reversed polarity of the node E voltage, but remains constant in magnitude, as the node E voltage magnitude remains at $V_R$. The magnitudes of currents $I_A$ and $I_B$ remain constant, although the directions thereof reverse, responsive to the change in node E polarity. Accordingly, the direction of flow of integrator capacitor current $I_C$ reverses and the integrator output voltage $V_C$ linearly decreases, toward operating voltage $-V$, until output voltage $V_C$ equals the negative reference voltage $(-V_R)$. At this time, the voltages at both inputs 42a and 42b of COMP. 2 are equal and the output 42c thereof is enabled to reset gate $G_1$ output 48c, opening switch means 56, and to set gate $G_2$ output 50c closing switch means 58 and placing the negative reference potential upon node E to restart the cycle. Thus, it will be seen that the waveform at output frequency terminal F, which is the voltage at gate $G_2$ output 50c, alternates between the gate set and gate reset output voltages, substantially equal to $+V$ and $-V$, respectively, with a total time interval T for one complete cycle, established by the rate at which the integrator output voltage ramps between the positive and negative reference voltage limits. The speed of integration is a function both of the magnitude of constant current $I_A$ (proportional to the constant reference voltage magnitude at node E) and of the variable magnitude of current $I_B$, which magnitude is proportional to the voltage $V_B$, itself proportional to the difference in sensor voltages $V_1$ and $V_2$. The output frequency f, where $f = 1/T$ is thus proportional to the integrator current $I_C$ and inversely proportional to the capacitance C of integrating capacitor 34 and to the magnitude $V_R$ of the reference voltage; i.e. $f = I_C/(4V_R C)$.

As the sensed physical parameter changes, the resistances $R_1$–$R_4$ of bridge 11 each change by some increment, denoted as $\Delta R_1$ to $\Delta R_4$, respectively. The change in differential bridge voltage $(V_1 - V_2)$ is a function of the bridge current $I_S$ (itself of constant magnitude $V_R/R_C$) and the resistance increments $\Delta R_1$, $\Delta R_2$, $\Delta R_3$ and $\Delta R_4$. Thus, $$(V_1 - V_2) = (I_S/4)(\Delta R_1 - \Delta R_2 + \Delta R_3 - \Delta R_4)$$

or $$V_B = (1 + (R_E/R_D))(V_R/4R_C)(\Delta R_1 - \Delta R_2 + \Delta R_3 - \Delta R_4)$$

and the frequency of the output waveform, at terminal F, is $$f = (\tfrac{1}{4}R_A C) + (1 + (R_E/R_D))(\tfrac{1}{4}R_C R_B C) R$$

where $R = (\Delta R_1 - \Delta R_2 + \Delta R_3 - \Delta R_4)$.
The output frequency is therefore a linear function of $\Delta R$, with the first output frequency term $(\tfrac{1}{4}R_A C)$ representing a reference frequency $f_o$ at which the sensed physical parameter is equal to a reference value, and with the second term being of the form $(m \Delta R)$, where m is a linear slope coefficient, of magnitude $(1 + R_E/R_D)(4R_B R_C C)$. See FIG. 2. The slope m of the output frequency f, with respect to the change $\Delta R$ in sensor resistance with a change in sensed physical parameter, can be conveniently varied by varying the resistance ratio RE/RD, by varying the magnitude of second current $I_B$ (by varying the resistance $R_B$ of resistor 38) or by adjusting the constant bridge current $I_s$ magnitude (by varying the resistance $R_C$ of resistor 16). It will be seen that the frequency of the output signal, at terminal F, is essentially independent of supply voltage.

Figure 3:
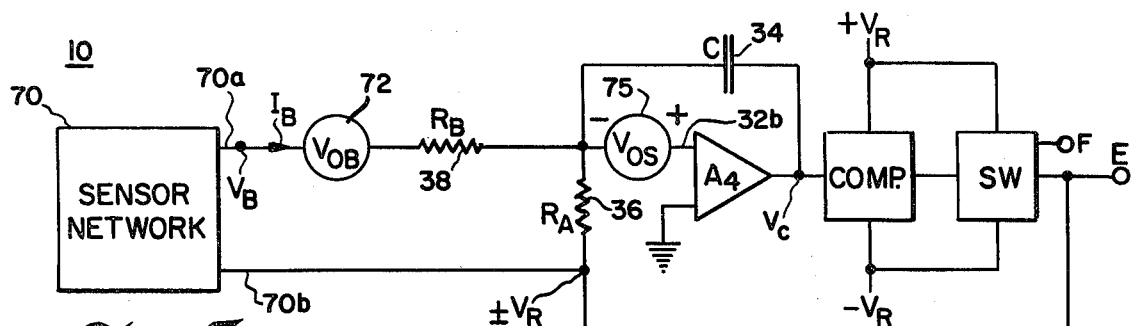
FIG. 3 is a schematic block diagram illustrating the automatic offset error correction of the converter circuit of FIG. 1.

Referring now to FIG. 3, the offset error at the input of integrating amplifier $A_4$ is automatically corrected to substantially remove offset voltage $V_{OS}$ as an error source in determining the frequency of the output signal converter for a particular differential bridge voltage. Converter circuit 10 may be considered as a sensor network 70 (including all of the circuitry to the left of broken line 65 in FIG. 1) having two leads 70a, at which voltage $V_B$ appears, and lead 70b, at which the reference voltage $\pm V_R$ is connected. The current $I_B$, flows in, and an offset error source 72 of magnitude $V_{OB}$ appears at, lead 70a. An offset voltage source 75, of magnitude $V_{OS}$, appears at the input 32b of amplifier $A_4$. When the integrator output voltage $V_C$ is rising, the node E voltage is $-V_R$, and the magnitudes of reference and offset error voltages $V_R$ and $V_{OS}$, respectively, are subtracted to reduce the time interval for the first half cycle of the output wave. However, after the voltage at node E is changed to $+V_R$, and the reference and offset error voltages $V_R$ and $V_{OS}$, respectively, are added, the time interval for the second half cycle is increased by approximately the same amount of time as the decrease in the first half cycle. Thus, the total integration error due to error sources 75 and 72 is averaged out over the entire cycle and essentially has no effect upon the duration of total time interval T (see FIG. 1) required for one cycle of the output frequency. If $I_B$ equals zero, and $V_{OB}$ is neglected, the output frequency $f_o$ is given by the expression:

$$f_0 = (1 - V_{OS}^2/V_R^2)/4R_A C.$$

If $(V_{OS}/V_R)^2$ is much less than 1, the frequency is essentially independent of the offset voltage $V_{OS}$. For example, if the reference voltage has a magnitude $V_R$ of 5 volts and if the offset error voltage $V_{OS}$ has a magnitude of about 10 millivolts, then the $(1 - V_{OS}^2/V_R^2)$ term has a value of about 0.999996, or about 0.0004% error. Conversion accuracy of better than 1 percent can thus be obtained even with operation amplifiers having relatively high values of effort error voltage. A typical low-cost operational amplifier, such as the u A741 and the like, has a maximum offset error voltage of $\pm 5$ millivolts, which is even less than the 10 millivolt example hereinabove. Similarly, the effect of the sensor network output error voltage $V_{OB}$, due to offset error voltages in the operational amplifiers $A_2$ and $A_3$ of the sensor network, is also averaged out during a complete cycle, in manner similar to the averaging of $A_4$ amplifier offset error voltage source 75.

Figure 4:
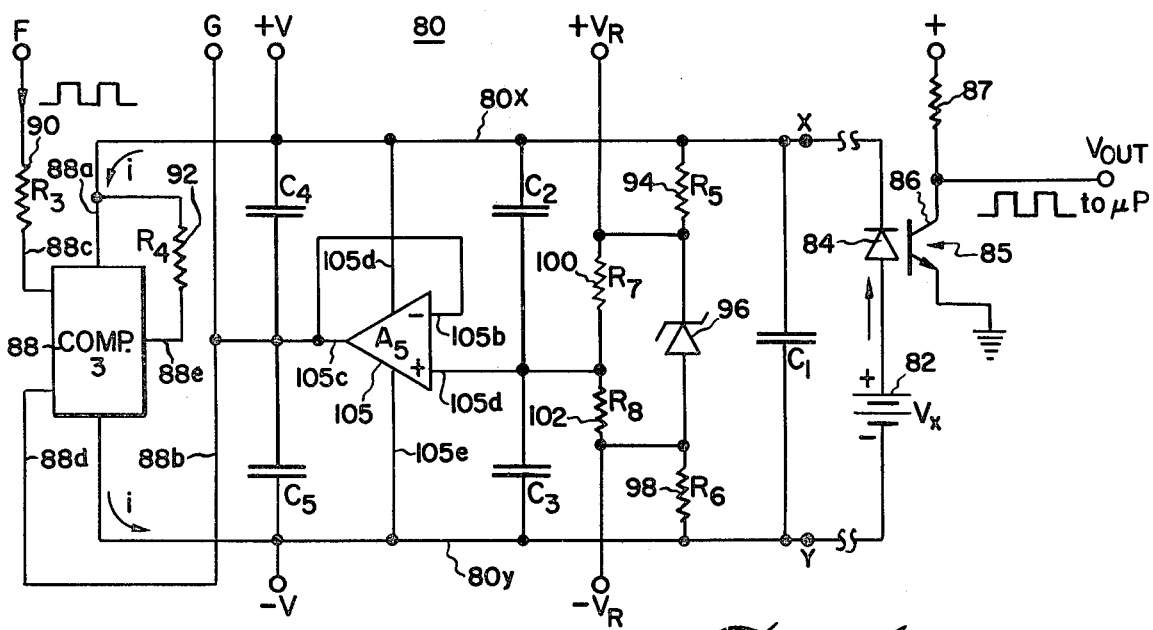
FIG. 4 is a schematic diagram of a power supply for enabling the converter circuit of FIG. 1 from a remote location.

Referring now to FIG. 4, a power supply 80 for providing operating potentials of magnitudes $\pm V$ and reference potentials of magnitudes $\pm V_R$, is shown. Power supply circuit 80 is itself provided with operational potential, of magnitude $V_X$, from a source 82 having its anode connected through the light-emitting-diode 84 portion of an optoelectronics coupler 85, to a first terminal X of the power supply circuit. Source 32 has its cathode connected to a second terminal Y of the power supply circuit. Advantageously, the source-LED circuit may be connected to terminals X and Y by a pair of wires which may be several hundred feet long, whereby source 82 and coupler 85 may be located adjacent to apparatus (not shown), such as a microprocessor (u P) and the like, which receives the variable-frequency output from coupler 85, while the resistance-bridge to frequency converter circuit 10 and the associated power supply circuit 80 are located adjacent to sensor 11 at the remote location at which the physical parameter in to be monitored.

Power supply circuit 80 includes a filter capacitor $C_1$ connected between input terminals X and Y for filtering noise and other extraneous signals picked up the relatively long wire runs between the source-coupler and power supply circuits. Terminals X and Y are respectively connected to positive and negative operating potential buses 80x and 80y, from which the positive and negative converter operating potentials $+V$ and $-V$ are respectively obtained. A third comparator 88 (COMP. 3) has a positive supply terminal 88a and a negative supply terminal 88b, respectively connected to buses 88x and 88y. A first COMP. 3 input 88c is connected to the output frequency terminal F, of converter circuit 10, through a resistor 90 of resistance $R_3$. A second COMP. 3 input terminal 88d is connected to virtual-ground terminal G. Comparator output 88e is connected to positive operating potential bus 80x through a resistor 92 of magnitude $R_4$.

In series, from positive operating potential bus 80x to negative operating potential bus 80y, is: a first resistance 94, having a resistance $R_5$; a zener diode 96, having its anode connected to resistor 94; and a second resistor 98 of resistance value $R_6$. In series across zener diode 96 is a third resistor 100 having a resistance $R_7$ and a fourth resistance 102, having a resistance $R_8$. The positive reference voltage $(+V_R)$ is obtained at the junction between resistors 94 and 100, at the anode of zener 96, while the negative reference potential $(-V_R)$ is obtained at the junction between resistors 98 and 102, at the cathode of zener 96. A pair of filter capacitors $C_2$ and $C_3$ are respectively connected between the junctions of resistors 94 and 100 and resistors 98 and 102 and the respective positive and negative operating potential buses 80x and 80y, respectively. The junction between resistors 100 and 103 is also connected to the non-inverting input 105a of a fifth operational amplifier 105. An inverting input 105b of the fifth operational amplifier $A_5$ is connected to the amplifier output 105c, whereby amplifier $A_5$ acts as a unity-gain voltage follower with the voltage at amplifier output 105c, connected to virtual-ground terminal G, being essential equal to the voltage at the junction between resistances 100 and 102. Amplifier $A_5$ has its positive supply terminal 105d and its negative supply terminal 105e respectively connected to positive and negative operating potential buses 80x and 80y. Another pair of filter capacitors $C_4$ and $C_5$ are connected from amplifier output 105c to the respective positive and negative operating potential buses. It will be seen that, if resistors 100 and 102 are of equal, fixed value, the voltage at the junction therebetween is the virtual-ground voltage and the voltage across each of resistors 100 and 102, which voltages are the positive and negative reference voltages, are equal to each other and to one-half of the zener voltage of zener diode 96. The zener voltage is less than the voltage between supply rails 80x and 80y, e.g. the source voltage $V_x$, whereby each of the positive and negative operating potentials $+V$ and $-V$ is equal to one-half the voltage between power supply circuit terminals X and Y, which operating potentials are greater in magnitude than the magnitude of the positive and negative reference voltages $+V_R$ and $-V_R$.

In operation, COMP. 3 compares the parameter-dependent frequency waveform, having peaks of $\pm V$, to the virtual-ground voltage at input 88d. Thus, the comparator is turned on for each positive half-cycle and off for each negative half-cycle of the converted frequency waveform. The comparator draws a pulse of current, of magnitude i, from positive input terminal 88a to negative return terminal 88b, during each positive half-cycle. The pulse of current flows from source 82 through the light-emitting diode 84 of the coupler and produces a change in the intensity of light emitted from LED 84 during each positive half-cycle, whereby the associated phototransistor 86 of the optical coupler is turned on and draws current through its load 87. The magnitude of the coupled output voltage $V_{out}$ is at a relatively low value during the positive half-cycle of the parameter-sensing frequency waveform and is at a high value during each negative half-cycle of that waveform, whereby the waveform of the output voltage has the same frequency as the frequency f at resistance-bridge to frequency converter output terminal F.

While the present invention has been described with respect to one presently preferred embodiment thereof, many modifications and variations will now become apparent to those skilled in the art. It is my intention, therefore, to be limited only by the scope of the impending claims and not by the specific details recited herein.

What is claimed is:

1. A circuit for converting the magnitude of a sensed physical parameter to the periodic frequency of a waveform, comprising:

a sensor having first through fourth terminals and having an equivalent electrical resistance appearing between each pair of said terminals, which resistance varies proportional to the magnitude of the physical parameter to be sensed;

means connected to the first and second terminals of said sensor for providing a current flow of an essentially constant magnitude through the resistances of said sensor;

means connected to the third and fourth terminals of said sensor for generating a first voltage having a magnitude proportional to the magnitude of the physical parameter sensed by said sensor; and means for converting said first voltage to said waveform having a frequency substantially proportionally to the magnitude of said sensed physical parameter, including first and second reference potential sources, having essentially identical magnitudes and opposite polarities;

means having first and second inputs respectively receiving said first voltage and a second voltage for integrating, with respective to time, the sum of the first and second voltages to provide an output voltage;

comparative means receiving said first and second reference potentials and said output voltage of said integrating means for providing first or second signals when the output voltage of said integrating means is equal to said first or second reference potentials, respectively; and means for connecting said first or second reference potential to a common node, at which said second voltage appears with polarity selected to reverse the integration direction of said integrating means, responsive respectively to the generation of said comparing means first or second signal;

each of said first and second signals periodically alternating in polarity at a frequency substantially proportional to said first voltage; one of said first and second signals being said waveform.

2. The converter circuit of claim 1, wherein said comparing means includes a first comparator having first and second input terminals respectively receiving said first reference potential and said integrating means output voltage, and having an output at which said first signal appears responsive to the voltages at said first comparator input terminals being equal; and a second comparator having first and second input terminals respectively receiving said second reference potential and said integrating means output voltage, and having an output at which said second signal appears responsive to the voltages at said second comparator input terminals being equal.

3. The converter circuit of claim 3, further comprising a bistable storage circuit having first and second inputs respectively receiving said first and second signals from said first and second comparators, and having a first output which is set and reset, and a second output which is reset and set, responsive respectively to the presence of said first and second signals.

4. The converter circuit of claim 3, wherein said bistable circuit comprises a pair of cross-coupled logic gates, each having an input receiving a different one of said first and second signals.

5. The converter circuit of claim 4 further comprising switch means receiving said first and second reference potentials and the set signals from said bistable means first and second outputs for coupling one of said first and second reference potentials to said integrating means second input responsive to the presence of a respective one of said first and second signals from said first and second comparators.

6. The converter circuit of claim 1, wherein said integrating means includes a virtual ground; an operational amplifier having a first input connected to said virtual ground, a second input and an output at which said integrating means output voltage appears; an integration capacitance connected between said operational amplifier second input and said operational amplifier output; and first and second input resistances each having one terminal connected to said operational amplifier second input and receiving at their remaining terminals respectively said first voltage and the alternating polarity reference potentials at said common node.

7. The converter circuit of claim 1, wherein said current flow providing means includes an operational amplifier having an input connected to said first sensor terminal and an output connected to said second sensor terminal; and a resistance element having a first terminal connected to said amplifier input and a second terminal connected to said common node to receive said alternating polarity first and second reference potentials; the magnitude of said resistance and said essentially identical magnitudes of said first and second reference potentials establishing the magnitude of said essentially constant magnitude current flow through said sensor resistances.

8. The converter circuit of claim 1, wherein said first voltage generating means comprises an amplifier means, having first and second inputs respectively connected to said third and fourth terminals of said sensor and having an output, for providing said first voltage at said amplifier means output responsive to the difference between a voltage at said sensor third terminal and a voltage at said sensor fourth terminal.

9. The converter circuit of claim 8, wherein said amplifier means comprises a first operational amplifier having a first input connected to said sensor third terminal, a second input and an output;

a second operational amplifier having a first input connected to said sensor fourth terminal, a second input and an output at which said first voltage appears;

first and second resistances of essentially equal magnitude and respectively connected between said first operational amplifier second input and a virtual ground, and between said second operational amplifier second input and output; and third and fourth resistances of essentially equal magnitudes and respectively connected between said first operational amplifier second input and output, and between said first operational amplifier output and said second operational amplifier second input.

10. The converter circuit of claim 9, wherein said first and second resistance elements have a magnitude $R_E$, said third and fourth resistance elements have a magnitude $R_D$, said sensor third terminal has a voltage thereat of magnitude $V_1$ and said sensor fourth terminal has a voltage thereat of magnitude $V_2$; said amplifier providing said first voltage substantially equal to $(1+(R_E/R_D))(V_1-V_2)$.

11. The converter circuit of claim 1, further comprising a source of converter circuit operating potential at a location remote from said converter; and wherein said first and second reference potential sources are connected to said converter circuit operating potential source.

12. The converter circuit of claim 11 wherein said first and second reference potential sources include: means energized by said converter circuit operating potential source for generating an essentially constant voltage; and a pair of series-connected resistance elements connected in parallel across said essentially constant voltage generating means; the junction between said series-connected resistance elements forming a virtual ground for said converter circuit and said first and second reference voltages appearing, with respect to said virtual ground, at the resistance elements terminals furthest from said virtual ground.

13. The converter circuit of claim 12, further including a source follower buffer having an input connected to the junction between said resistance elements and an output connected to the virtual ground of said converter circuit.

14. The converter circuit of claim 11, further comprising means receiving the output of said first voltage converting means for drawing, from said converter circuit operating potential source, a pulse of current once during each cycle of the output frequency of said converter circuit waveform; and means in series between said pulse current drawing means and said converter circuit operating potential source for providing a digital output representative of the frequency of said current pulses.

* * * * *